United States Patent
Milne et al.

(10) Patent No.: US 7,068,071 B1
(45) Date of Patent: *Jun. 27, 2006

(54) INTEGRATED CIRCUIT WITH OVERCLOCKED DEDICATED LOGIC CIRCUITRY

(75) Inventors: Roger B. Milne, Boulder, CO (US); Jonathan B. Ballagh, Longmont, CO (US)

(73) Assignee: Xilinx, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/970,962

(22) Filed: Oct. 22, 2004

Related U.S. Application Data

(63) Continuation of application No. 10/456,332, filed on Jun. 6, 2003, now Pat. No. 6,911,840.

(51) Int. Cl.
*H03K 7/38* (2006.01)

(52) U.S. Cl. .............................. 326/41; 326/38; 326/47; 326/39

(58) Field of Classification Search ............ 326/37–47, 326/93
See application file for complete search history.

(56) References Cited

U.S. PATENT DOCUMENTS

| 6,449,628 | B1 | 9/2002 | Wasson |
| 6,504,398 | B1 * | 1/2003 | Lien et al. ..................... 326/41 |
| 6,573,749 | B1 | 6/2003 | New et al. |
| 6,911,840 | B1 * | 6/2005 | Milne et al. .................. 326/38 |
| 2002/0089348 | A1 | 7/2002 | Langhammer |

* cited by examiner

*Primary Examiner*—Anh Q. Tran
(74) *Attorney, Agent, or Firm*—Robert Brush

(57) ABSTRACT

An integrated circuit with overclocked embedded logic circuitry is described. In an example, a programmable logic device includes programmable logic blocks operable using a first clock signal having a first frequency. A dedicated logic circuit embedded within the programmable logic device is operable using a second clock signal synchronized with the first clock signal and having a second frequency, the second frequency being a multiple of the first frequency. An interface coupled between one or more of the programmable logic blocks and the dedicated logic circuit includes multiplexer circuitry to multiplex output signals produced by the one or more programmable logic blocks among input terminals of the dedicated logic circuit.

4 Claims, 4 Drawing Sheets

INTEGRATED CIRCUIT WITH OVERCLOCKED DEDICATED LOGIC CIRCUITRY

This application is a continuation of Ser. No. 10/456,332, now U.S. Pat. No. 6,911,840.

FIELD OF THE INVENTION

One or more aspects of the invention relate generally to programmable devices and, more particularly, to programmable devices with overclocked dedicated circuitry and/or to a programmable multiply-accumulator circuit.

BACKGROUND OF THE INVENTION

Programmable logic devices (PLDs) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, known as a field programmable gate array (FPGA), is very popular because of a superior combination of capacity, flexibility, time-to-market, and cost.

An FPGA typically includes an array of configurable logic blocks (CLBs) surrounded by a ring of programmable input/output blocks (IOBs). The CLBs and IOBs are interconnected by a programmable interconnect structure. The CLBs, IOBs, and interconnect structure are typically programmed by loading a stream of configuration data (bitstream) into internal configuration memory cells that define how the CLBs, IOBs, and interconnect structure are configured. The configuration bitstream may be read from an external memory, conventionally an external integrated circuit memory EEPROM, EPROM, PROM, and the like, though other types of memory may be used. The collective states of the individual memory cells then determine the function of the FPGA.

Dedicated logic circuits configured to perform specific functions are commonly embedded into PLDs. For example, the Virtex®-II family of FPGAs manufactured by Xilinx, Inc., include dedicated multipliers. Current approaches for embedding dedicated logic circuitry within a PLD are fundamentally limited in input/output (I/O) capacity by the routing and data-path processing capabilities of the programmable fabric to which the dedicated logic circuitry is attached. For example, a design in an FPGA may have a data path clocked at 300 MHz. A multiplier, attached to the data path of the FPGA, is also clocked at 300 MHz, even though a multiplier fabricated with the same process used for the FPGA is capable of being clocked at a higher rate.

Notably, conventional dedicated logic circuitry within an FPGA that operates using a higher or lower clock frequency than that of the FPGA fabric is clock asynchronously from the FPGA fabric. For example, embedded microprocessors, boundary scan circuitry, and I/O transceivers all operate asynchronously with respect to the FPGA fabric. Data transfer between the FPGA fabric and such dedicated logic circuits is effectuated using asynchronous communication between the FPGA fabric and the dedicated logic circuit (e.g., a first-in, first-out (FIFO) interface), or a handshaking mechanism (e.g., a processor bus and peripheral management).

Therefore, it would be desirable and useful to have an integrated circuit with embedded dedicated logic circuitry capable of operating at a higher clock rate and at least partially synchronous with programmatically configurable logic of such an integrated circuit.

SUMMARY OF THE INVENTION

An aspect of the invention is a programmable logic device with overclocked dedicated logic circuitry. In an embodiment, the programmable logic device includes programmable logic blocks operable using a first clock signal having a first frequency. A dedicated logic circuit embedded within the programmable logic device is operable using a second clock signal synchronized with the first clock signal and having a second frequency, the second frequency being a multiple of the first frequency. An interface coupled between one or more of the programmable logic blocks and the dedicated logic circuit includes multiplexer circuitry to multiplex output signals produced by the one or more programmable logic blocks among input terminals of the dedicated logic circuit.

Another aspect of the invention is an integrated circuit comprising programmatically configurable logic circuitry in electrical communication with dedicated application specific circuitry. The programmatically configurable logic circuitry operable in a first time domain, and the dedicated application specific circuitry operable in a second time domain. Frequency of the second time domain is a multiple of frequency of the first time domain, and the first time domain and the second time domain are sufficiently phase aligned with respect to corresponding timing signal transitions for synchronous operation between the programmatically configurable logic circuitry and the dedicated application specific circuitry.

Another embodiment of the present invention includes a programmable multiply-accumulator circuit (MAC). The MAC includes: a multiplier circuit coupled to an adder/subtractor circuit, where the multiplier circuit receives a first input signal selected from a plurality of first input signals by a first control signal; an accumulator circuit receiving a second input from the adder/subtractor circuit, where an output signal of the accumulator circuit is sent back to the adder/subtractor circuit depending on a value of a second control signal; and a pattern generator configured to produce the first and second control signals responsive to at least one operational (OP) code. In addition the MAC may also include a clock multiplier circuit providing a first clock signal to the pattern generator, where a first frequency of the first clock signal is proportional to a second frequency of a second clock signal. In one aspect of the present invention where the multiplier circuit is a dedicated hardwire circuit, and the MAC is embedded in a PLD, for example, an FPGA, the clock supplied to multiplier is a multiple of the clock for at least some part of the rest of the PLD. Hence the multiplier circuit can be over-clocked with respect to the rest of the PLD.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Programmable logic device with overclocked dedicated logic circuitry is described. One or more aspects of the invention relate to dedicated multiply-accumulate circuits embedded within an FPGA. Those skilled in the art will appreciate, however, that the invention may be employed with other types of dedicated logic circuits that are capable of operating in a time-multiplexed mode, such circuits being embedded within other types of programmable logic devices, such as a CPLD, or other integrated circuits with programmatically configurable logic.

Figure 1:
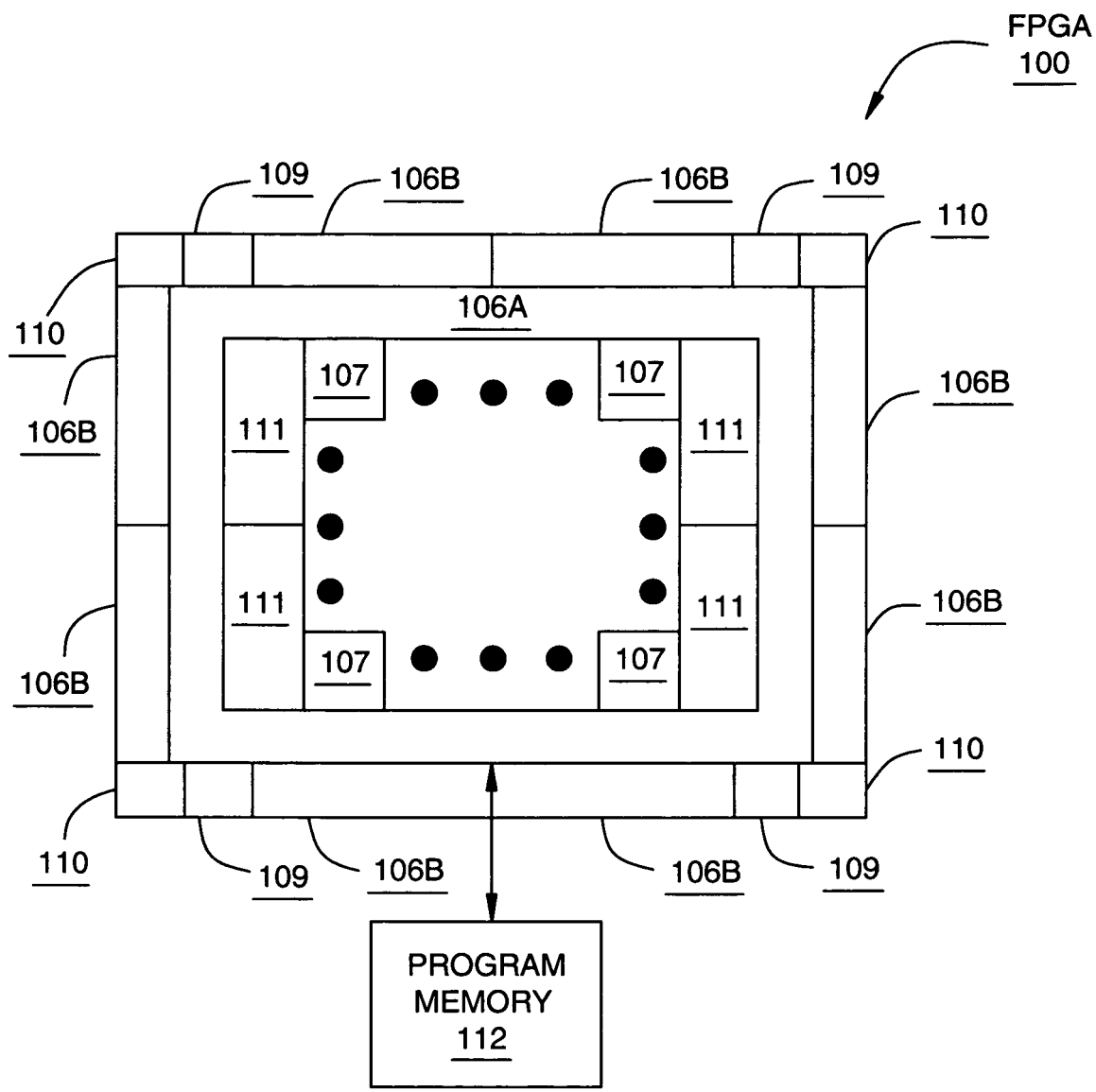
FIG. 1 depicts a block diagram of an exemplary embodiment of a field programmable gate array (FPGA) coupled to a program memory.

FIG. 1 depicts a block diagram of an exemplary embodiment of a field programmable gate array (FPGA) 100 coupled to a program memory 112. FPGA 100 illustratively includes CLBs 107, I/O routing ring 106A ("programmable interconnect"), memory 111, such as random access memory, delay lock loop (DLL) blocks 109, multiply/divide/de-skew clock circuits 110, and programmable IOBs 106B. DLL blocks 109 and clock circuits 110 collectively provide digital clock management (DCM) circuits for managing clock signals within FPGA 100. FPGA 100 may include other types of logic blocks and circuits in addition to those described herein.

CLBs 104 are programmably connectable to each other, and to I/O routing ring 108, for performing various types of logic functions. Each of CLBs 104 may include one or more "slices" and programmable interconnect circuitry (not shown). Each CLB slice in turn includes various circuits, such as flip-flops, function generators (e.g., look-up tables (LUTs)), logic gates, memory, and like type well-known circuits.

Programmable IOBs 106B (and Multi-gigabit transceivers (MGTs), not shown) are configured to provide input to, and receive output from, one or more of CLBs 107. Configuration information for CLBs 107, I/O routing ring 106A, and programmable IOBs 106B is stored in memory 111. Briefly stated, a configuration bitstream produced from program memory 112 is coupled to a configuration port of FPGA 900 to implement a desired circuit therein.

A programmable function block includes circuitry that can be programmed to perform one or more functions. An example of a programmable function block is a programmable logic block, which in the context of an FPGA may include, the CLBs 107, I/O routing ring 106A, and programmable IOBs 106B (and MGTs).

Figure 2:
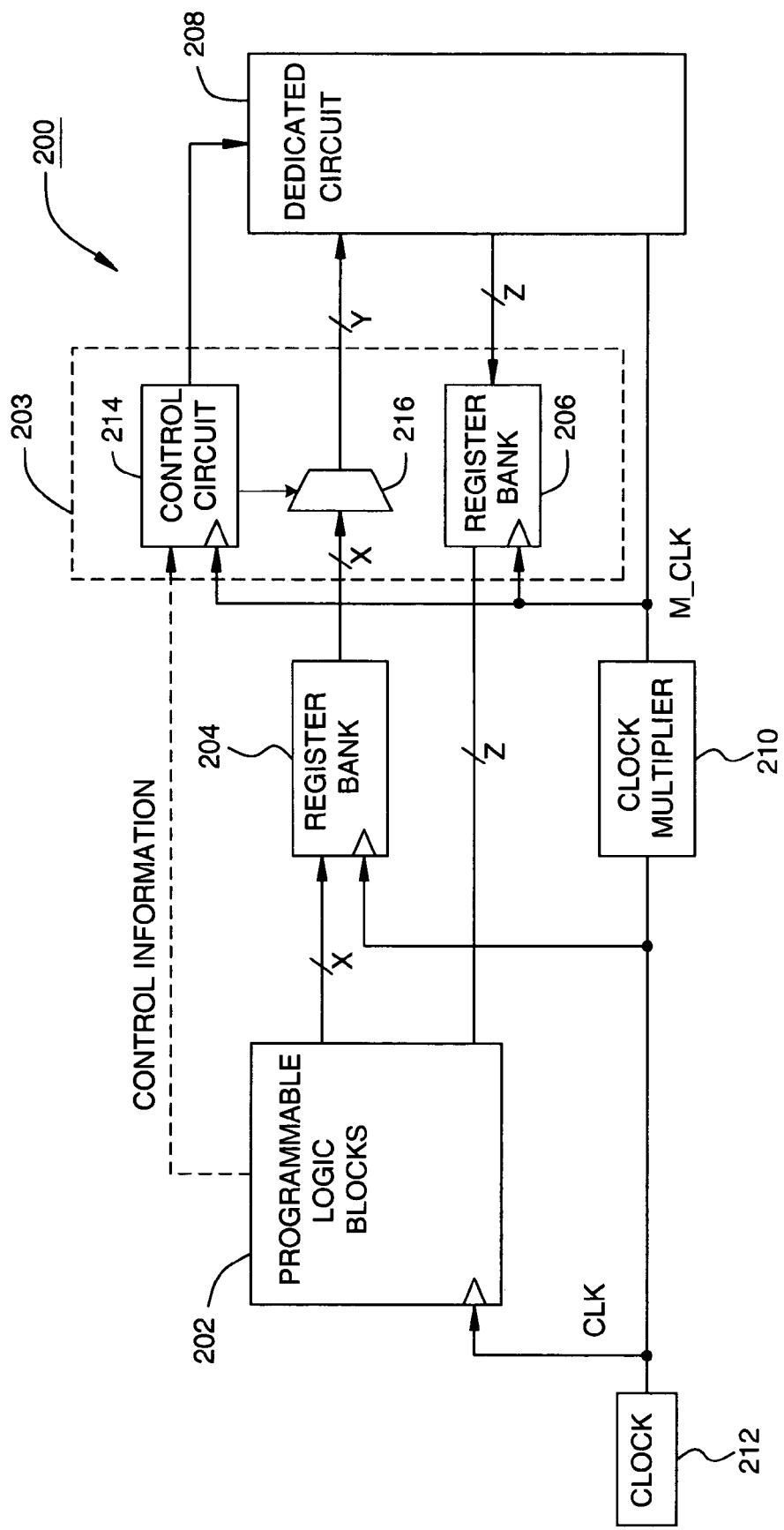
FIG. 2 depicts a block diagram showing an exemplary embodiment of a portion of an FPGA having embedded dedicated logic circuitry.

FIG. 2 depicts a block diagram showing an exemplary embodiment of a portion 200 of an FPGA having embedded dedicated hardwired circuitry. Portion 200 includes programmable logic blocks 202, a bank of registers ("register bank" 204), interface circuitry 203, a dedicated circuit 208, and a clock multiplier 210. Alternatively, the clock multiplier 210 may be part of interface circuitry 203 or part of dedicated logic circuitry 208.

Programmable logic blocks 202 include CLBs, IOBs (MGTs), and I/O routing, which may be configured to implement a user-defined circuit. Synchronous circuit elements within programmable logic blocks 202 operate in response to a clock signal, CLK, provided by a clock 212. Dedicated circuit 208 includes hardwired circuitry embedded within portion 200 configured to perform a specific function, such as, for example, an arithmetic function or a digital signal processing (DSP) function. Synchronous circuit elements within dedicated circuit 208 operate in response to a clock signal, M_CLK, provided by clock multiplier 210. Clock signal M_CLK is synchronized with clock signal CLK, but has a frequency that is a multiple, M, of the frequency of clock signal CLK, where M in one embodiment is an integer. In an alternative embodiment M is any number, including a fractional number, i.e., the frequency of M_CLK is proportional to the frequency of CLK, and M_CLK need not be synchronized with clock signal CLK on every cycle of CLK, but M_CLK may be synchronized on a number K of CLK clock cycles, where K is any positive number, including a whole or fractional number. Dedicated circuit 208 is thus "overclocked" with respect to programmable logic blocks 202.

Interface circuitry 203 effectuates data transfer between programmable logic blocks 202 and dedicated circuit 208 such that, to the FPGA fabric, dedicated circuit 208 appears to operate at the data rate of the FPGA fabric using the clock signal that is used by the logic in circuit 202. Notably, for each cycle of clock signal CLK, programmable logic blocks 202 provide input data to interface circuitry 203 and receive output data from interface circuitry 203. However, for each cycle of clock signal CLK, dedicated circuit 208 processes the input data to produce the output data in accordance with multiple cycles of clock signal M_CLK.

Interface circuitry 203 effectively isolates dedicated circuit 208 from programmable logic blocks 202 such that, from the viewpoint of programmable logic blocks 202, dedicated circuit 208 operates in accordance with clock signal CLK. At the same time, interface circuitry 203 allows dedicated circuit 208 to operate using a clock frequency higher than that of programmable logic blocks 202. For example, dedicated circuit 208 may be configured to perform multiple, e.g., arithmetic and/or DSP, operations to provide multiple output data using a single set of input data from programmable logic blocks 202.

In particular, an input bus of register bank 204 receives input data from programmable logic blocks 202. The input bus of register bank 204 has a data width of X, where X is an integer greater than zero. In an embodiment, the input bus of register bank 204 receives the input data from the programmable interconnect circuitry within programmable logic blocks 202. Registers within register bank 204 load data in response to clock signal CLK. An output bus of register bank 204 provides the input data to multiplexer circuitry 216.

A control bus of multiplexer circuitry 216 receives control signal(s) from control circuit 214. Control circuit 214 operates in response to clock signal M_CLK. Control circuit 214 causes multiplexer circuitry 216 to selectively multiplex the input data from register bank 204 to provide output data to dedicated circuit 208. The output bus of multiplexer circuitry 216 has a data width of Y, where Y is an integer greater than zero.

Since register bank 204 is operated in response to clock signal CLK, data on the output bus of register bank 204 is static for M clock cycles of clock signal M_CLK. In an embodiment, programmable logic blocks 202 may be configured to provide control information to control circuit 214.

For example, dedicated circuit 208 may have several modes of operation that are selectable using the control information.

Notably, clock signal CLK is coupled to an input of clock multiplier 210, which multiples clock signal CLK by M. An output of clock multiplier 210 provides clock signal M_CLK. In an embodiment, clock signal M_CLK has a frequency that is an integer multiple of the frequency of clock signal CLK. For example, clock signal M_CLK may have a frequency that is two, three, or four times that of clock signal CLK.

An input bus of register bank 206 receives output data from dedicated circuit 208. The input bus of register bank 206 has a data width of Z, where Z is an integer greater than zero. Registers within register bank 206 load data in response to clock signal M_CLK. An output bus of register bank 206 provides the output data to programmable logic blocks 202.

Since dedicated circuit 208 is operated in response to clock signal M_CLK, the output data coupled to the input bus of register bank 206 may change M times for each cycle of clock signal CLK. Register bank 206 "captures" the output data of dedicated circuit 208 such that the entire output data may be provided to programmable logic blocks 202.

Figure 3:
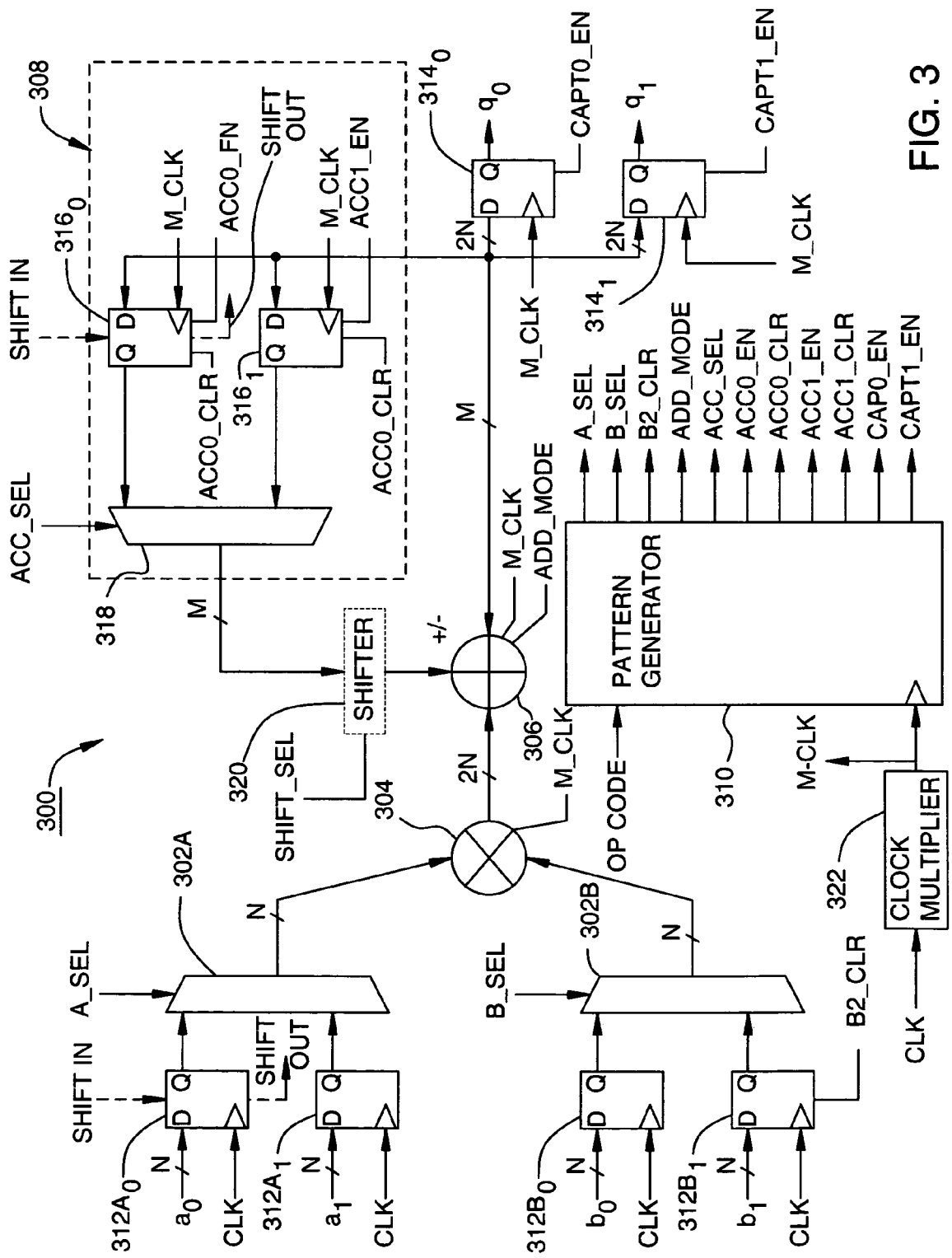
FIG. 3 depicts a block diagram showing an exemplary embodiment of a two-times overclocked multiply-accumulate circuit embedded within an FPGA.

FIG. 3 depicts a block diagram showing an exemplary embodiment of a two-times overclocked multiply-accumulate circuit (MAC) 300 embedded within an FPGA. MAC 300 includes multiplexers 302A and 302B (collectively referred to as multiplexers 302), multiplier 304, adder/subtracter 306, accumulator circuitry 308, and pattern generator 310. Accumulator circuitry 308 includes registers $316_0$ and $316_1$ (collectively referred to as registers 316), multiplexer 318, and an optional shifter 320. Multiplier 304 may be a very large scale integrated (VLSI) pipelined multiplier, and adder/subtracter 306 may be a VLSI pipelined adder/subtracter. MAC 300 may be fabricated with the same process used to fabricate the FPGA in which MAC 300 is embedded.

MAC 300 receives input data from registers $312A_0$, $312A_1$, $312B_0$, and $312B_1$ (collectively referred to as registers 312). MAC 300 provides output data to registers $314_0$ and $314_1$ (collectively referred to as registers 314). In an embodiment, registers 312 and registers 314 are dedicated circuit elements formed within the FPGA. For example, registers 312 and registers 314 may be fabricated as part of MAC 300. Alternatively, registers 312 and registers 314 may be part of the programmable logic of the FPGA. For example, registers 312 and registers 314 may be part of CLBs within the FPGA.

A clock signal CLK that is used to clock synchronous circuit elements within the programmable logic of the FPGA is coupled to a clock multiplier 322. Clock multiplier 322 multiplies clock signal CLK to produce a clock signal M_CLK having a frequency twice that of clock signal CLK. Operation of clock multiplier 322 is well-known in the art. In an embodiment, clock multiplier 322 is fabricated as part of MAC 300. Alternatively, clock multiplier 322 may be part of a DCM circuit with the FPGA.

Registers 312 load data in accordance with clock signal CLK. Registers 314 load data in accordance with clock signal M_CLK. Notably, input buses of register $312A_0$ and register $312A_1$ are respectively configured to receive signals $a_0$ and $a_1$. Input buses of register $312B_0$ and register $312B_1$ are respectively configured to receive signals $b_0$ and $b_1$.

Signals $a_0$, $a_1$, $b_0$, and $b_1$ are provided by programmable logic blocks of the FPGA. Each of signals $a_0$, $a_1$, $b_0$, and $b_1$ has a data width of N bits.

Output buses of register $314_0$ and $314_1$ respectively provide signals $q_0$ and $q_1$. Signals $q_0$ and $q_1$ are provided to the programmable logic blocks of the FPGA. In addition, an operational code (OP code) signal, in one embodiment of the present invention may be provided by programmable logic blocks of the FPGA to pattern generator 310. The OP code may be used to select a specific one of a plurality of operations that may be performed by MAC 300. Pattern generator 310 produces an output pattern in response to clock signal M_CLK.

In an alternative embodiment of the present invention the OP code signal is supplied from the decoding of a software program instruction. The software program may be executed by an embedded microprocessor such as in the Virtex II Pro FPGA by Xilinx Corporation of San Jose Calif. In yet another embodiment the OP code may be stored in an FPGA's configuration memory and may be changed by partially reconfiguring the FPGA.

Output buses of register $312A_0$ and $312A_1$ are respectively coupled to inputs of multiplexer 302A. Output buses of register $312B_0$ and $312B_1$ are respectively coupled to inputs of multiplexer 302B. Control terminals of multiplexer 302A and multiplexer 302B are respectively configured to receive signals A_SEL and B_SEL. Signals A_SEL and B_SEL are generated by pattern generator 310 in accordance with the OP code. The logical value of signal A_SEL determines which of signals $a_0$ and $a_1$ is selected by multiplexer 302A. Likewise, the logical value of signal B_SEL determines which of signals $b_0$ and $b_1$ is selected by multiplexer 302B.

Output buses of multiplexer 302A and multiplexer 302B are respectively coupled to multiplier 304. Multiplier 304 multiplies the signals provided by multiplexers 302 in response to clock signal M_CLK. Multiplier 304 provides an output signal having a data width of 2N bits to adder/subtracter 306. Adder/subtracter 306 adds or subtracts the output signal of multiplier 304 and an output signal of multiplexer 318 in response to clock signal M_CLK. A control terminal of adder/subtracter 306 is configured to receive signal ADD_MODE. Signal ADD_MODE is generated by pattern generator 310 in accordance with the OP code. The logical value of signal ADD_MODE determines whether adder/subtracter 306 performs an addition operation or a subtraction operation. Adder/subtracter 306 provides an output signal having a data width of M bits.

Input buses of register $314_0$ and $314_1$ are respectively coupled to the output of adder/subtracter 306. The input buses of registers 314 have a data width of 2N bits. Control terminals of register $314_0$ and register $314_1$ are configured to respectively receive signals CAPT0_EN and CAPT1_EN. Signals CAPT0_EN and CAPT1_EN are generated by pattern generator 310 in accordance with the OP code. The logical value of signal CAPT0_EN determines whether register 3140 is enabled. Likewise, the logical value of signal CAPT1_EN determines whether register 314, is enabled.

Input buses of register $316_0$ and register $316_1$ are respectively coupled to the output of adder/subtracter 306. Control terminals of register $316_0$ are respectively configured to receive signals ACC0_CLR and ACC0_EN. Control terminals of register $316_1$ are respectively configured to receive signals ACC1_CLR and ACC0_CLR. Signals ACC0_CLR, ACC0_EN, ACC1_CLR, and ACC1_EN are generated by pattern generator 310 in accordance with the OP code. The logic value of signals ACC0_CLR and ACC1_CLR respectively determine whether registers $316_0$ and $316_1$ are cleared. The logic value of signals ACC0_EN and ACC1_EN respectively determine whether registers $316_0$ and $316_1$ are enabled.

Input buses of multiplexer 318 are respectively coupled to output buses of register $316_0$ and register $316_1$. A control terminal of multiplexer 318 is configured to receive signal ACC_SEL. Signal ACC_SEL is generated by pattern generator in accordance with the OP code. The logical value of signal ACC_SEL determines which of the output buses of registers $316_0$ and $316_1$ is selected by multiplexer 318. As described above, an output bus of multiplexer 318 is coupled to adder/subtracter 306.

In general, MAC 300 is capable of performing two multiply-accumulate operations for each cycle of clock signal CLK. The type of multiply-accumulate operation is determined by the OP code. During each cycle of clock signal CLK, MAC 300 will clock-in an OP code as well as input data (i.e., $a_0$, $a_1$, $b_0$ and $b_1$). The OP code may be arbitrarily selected by the programmable logic of the FPGA during operation of MAC 300, allowing MAC 300 to be used for many purposes. Alternatively, the OP code may be loaded during configuration of the FPGA.

Operation of MAC 300 may be understood with reference to the following two examples. In a first example, MAC 300 is configured via the OP code(s) to perform two multiplication operations such that output signal $q_0$ is equal to the product of input signal $a_0$ and input signal $b_0$, and output signal $q_0$ is equal to the product of input signal $a_1$ and input signal $b_1$. In a first cycle of clock signal M_CLK, MAC 300 produces output signal $q_0$. Multiplexers 302 are configured to select input signals $a_0$ and $b_0$. Signals $a_0$ and $b_0$ are multiplied by multiplier 304. Accumulator circuitry 308 is configured to provide an output of zero such that the output of adder/subtracter 306 is the product of signals $a_0$ and $b_0$. Accumulator circuitry 308 may be configured to provide an output of zero by disabling both of registers 316. Register $314_0$ is enabled to capture the output of adder/subtracter 306, and register $314_1$ is disabled. In a second clock cycle of clock signal M_CLK, MAC 300 produces output signal $q_1$. Multiplexers 302 are configured to select input signals $a_1$ and $b_1$, which are multiplied by multiplier 304 and passed through adder/subtracter 306. In the second cycle, however, register $314_1$ is enabled to capture the output of adder/subtracter 306, and register $314_0$ is disabled.

In a second example, MAC 300 is configured to perform two multiplication-accumulation operations such that output signal $q_0$ is equal to the product of signal $a_0$ and signal $b_0$ summed with the product of signal $a_1$ and signal $b_1$ (i.e., $q_0 = a_0 b_0 + a_1 b_1$). In a first clock cycle of clock signal M_CLK, MAC 300 computes the product between signals $a_0$ and $b_0$. Multiplexers 302 are configured to select input signals $a_0$ and $b_0$, which are multiplied by multiplier 304 and passed through adder/subtracter 306. One of registers 316 is enabled to capture the output of adder/subtracter 306. In a second clock cycle of clock signal M_CLK, MAC 300 computes the product between signals $a_1$ and $b_1$, which is summed with the previously computed product between signals $a_0$ and $b_0$. Multiplexers 302 are configured to select input signals $a_1$ and $b_1$, which are multiplied by multiplier 304. Adder/subtracter 306 sums the output of multiplier 304 with the output of the one of registers 316 that captured the previously computed product between signals $a_0$ and $b_0$, which is provided by multiplexer 318. The output of adder/subtracter 306 is captured by register $314_0$.

It should be appreciate that MAC 300 may perform many operations, including the following:

| | | |
|---|---|---|
| Mode 1 - | $q_0 = a_0 b_0$, | $q_1 = a_1 b_1$ |
| Mode 2 - | $q_0 = q_0 \pm a_0 b_0$, | $q_1 = q_1 \pm a_1 b_1$ |
| Mode 3 - | $q_0 = a_0 b_0 \pm a_1 b_1$ | |
| Mode 4 - | $q_0 = q_0 \pm (a_0 b_0 \pm a_1 b_1)$ | |
| Mode 5 - | $q_0 = a_0 b_0 - a_1 b_1$, | $q_1 = a_0 b_1 + a_1 b_0$ |
| Mode 6 - | $q_0 = q_0 \pm (a_0 b_0 - a_1 b_1)$, | $q_1 = q_1 \pm (a_0 b_1 + a_1 b_0)$ | where one or more OP codes may perform one or more of the above modes. In modes 3 and 4 above, if it is desirable to produce an output signal $q_0$ that is the product between signals $a_0$ and $b_0$ summed with signal $a_1$, register $312B_1$ may be cleared using an optional signal B2_CLR provided by pattern generator 310. This obviates the need to load register $312B_1$ with the value of one. Modes 5 and 6 above are useful for complex arithmetic and require the input data and OP code to be static for two cycles of clock signal CLK, since a total of four multiply-accumulate operations are performed.

In an embodiment, registers 316 in accumulator circuitry 308 may include shift input terminals and shift output terminals. For purposes of clarity by example, only register $316_0$ is shown as having a shift input terminal and a shift output terminal. It is to be understood, however, that both of registers 316 may have shift input and output terminals. The shift input terminals of registers 316 may be configured to receive input data from the programmable logic blocks of the FPGA, or from another dedicated MAC. The shift output terminals of registers 316 may be configured to provide output data to the programmable logic blocks of the FPGA, or to yet another dedicated MAC. The shift input and output terminals of registers 316 allow MAC 300 to support addition operations involving additional signals $c_0$ and $c_1$, such as providing a signal $q_0$ equal to the product between signals $a_0$ and $b_0$ summed with signal $c_0$, and a signal $q_1$ equal to the product between signals $a_1$ and $b_1$ summed with signal $c_1$.

In an embodiment, the output bus of multiplexer 318 is coupled to a shifter 320. Shifter 320 is capable of providing a selectable shift to the output of multiplexer 318 in accordance with a signal SHIFT_SEL. The signal SHIFT_SEL may be generated using pattern generator 310 in response to the OP code. Shifter 320 allows MAC 300 to support double-precision multiplication-accumulation operations.

In an embodiment, registers 312 may support shift-style loading in addition to, or in place of, parallel-style loading. For purposes of clarity by example, only register $312A_0$ is shown as having a shift input terminal and a shift output terminal. It is to be understood, however, that one or more of registers 312 may have shift input and shift output terminals. Such shift-style loading allows MAC 300 to be cascaded with other MACs. For example, the shift input terminals of registers 312 may be coupled to shift output terminals of respective registers of another MAC. Likewise, the shift output terminals or registers 312 may be coupled to shift input terminals of respective registers of yet another MAC. Alternatively, the shift input and output terminals of registers 312 may be coupled to the programmable logic blocks of the FPGA.

MAC 300 may be converted into a four-times oversampling circuit. Notably, multiplexers 302 may be configured to have four input busses and clock signal M_CLK may have a frequency that is four times that of clock signal CLK.

Additional registers 312 may be used to provide input data to the additional input busses of multiplexers 302. If MAC 300 is configured as a four-times oversampling circuit, MAC 300 operates substantially as described above, but allows for four parallel multiply-accumulate operations per cycle of clock signal CLK. This allows for the computation of a complex product in a single clock cycle of clock signal CLK. It is noted that, in the case of a complex product, adder/subtracter 306 will be idle for two cycles of clock signal M_CLK. As such, two additional summing operations may be performed for each cycle of clock signal CLK (i.e., one complex product and two real additions per cycle of clock signal CLK).

MAC 300 may also be converted into a three-times oversampling circuit. Notably, multiplexers 302 may be configured to have three input busses and clock signal M_CLK may have a frequency that is three times that of clock signal CLK. Additional registers may be used to provide input data to the additional input busses of multiplexers. If MAC 300 is configured as a three-times oversampling circuit, MAC 300 operates substantially as described above, but allows for four parallel multiply-accumulate operations per cycle of clock signal CLK. It is noted that, in the case of a complex product and a three-times oversampling MAC circuit, specialized embodiments may be used. Notably, it is possible to perform a complex product operation with three real multiplications and five real additions/subtractions:

$$(a_r + ia_i)(b_r + ib_i) = (a_r b_r - a_i b_i) + (a_r b_i + a_i b_r)i$$
$$= (a_r[b_r + b_i] - b_i[a_r + a_i]) + (b_i[a_r + a_i] + a_i[b_r - b_i])i$$

and in the second formulation, the partial product, $a_r[b_r+b_i]$, is repeated, allowing the complex product to be computed with a total of three additions, two subtractions, and three multiplications. Such formulations are well known in the art.

Figure 4:
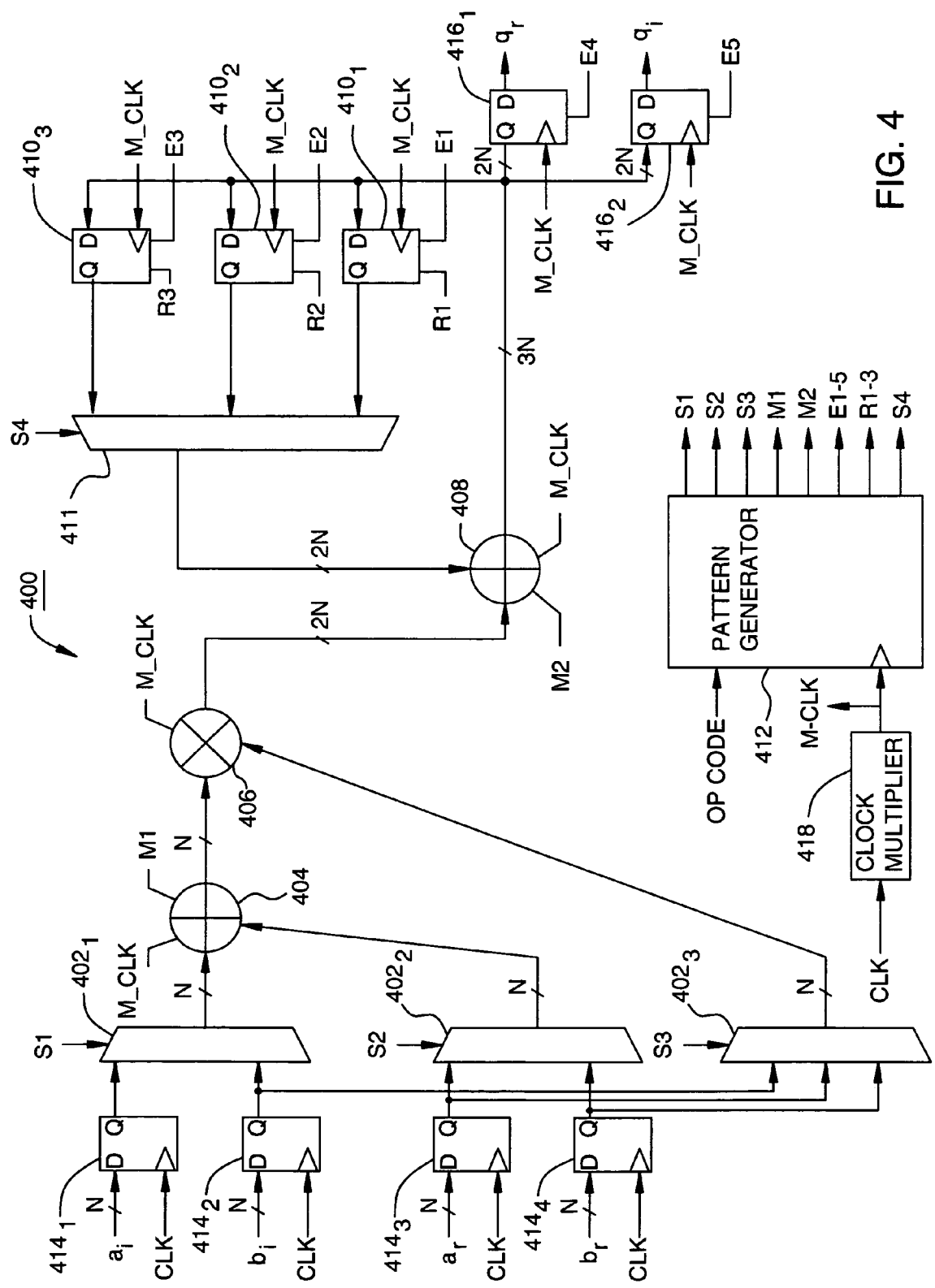
FIG. 4 depicts a block diagram showing an exemplary embodiment of a three-times overclocked multiply-accumulate circuit embedded within an FPGA.

FIG. 4 depicts a block diagram showing an exemplary embodiment of a three-times overclocked MAC 400 embedded within an FPGA. In operation, MAC 400 is optimized to perform a complex product in a single cycle of clock signal CLK. MAC 400 includes multiplexers $402_1$ through $402_3$ (collectively referred to as multiplexers 402), an adder/subtracter 404, a multiplier 406, an adder/subtracter 408, registers $410_1$ through $410_3$ (collectively referred to as registers 410), a multiplexer 411, and a pattern generator 412. Multiplier 406 may be a VLSI pipelined multiplier, and adder/subtracters 404 and 408 may be VLSI pipelined adder/subtracters. MAC 400 may be fabricated with the same process used to fabricate the FPGA in which MAC 400 is embedded.

MAC 400 receives input data from registers $414_1$ through $414_4$ (collectively referred to as registers 414). MAC 400 provides output data to registers 416, and 4162 (collectively referred to as registers 416). In an embodiment, registers 414 and registers 416 are dedicated circuit elements formed within the FPGA. For example, registers 414 and registers 416 may be fabricated as part of MAC 400. Alternatively, registers 414 and registers 416 may be part of the programmable logic of the FPGA. For example, registers 414 and registers 416 may be part of CLBs within the FPGA.

A clock signal CLK that is used to clock synchronous circuit elements within the programmable logic of the FPGA is coupled to a clock multiplier 418. Clock multiplier 418 multiplies clock signal CLK to produce a clock signal M_CLK having a frequency three-times that of clock signal CLK. In an embodiment, Clock multiplier 418 is fabricated as part of MAC 400. Alternatively, clock multiplier 418 may be part of a DCM circuit with the FPGA.

Registers 414 load data in accordance with clock signal CLK. Registers 416 load data in accordance with clock signal M_CLK. Notably, input buses of register $414_1$ and register $414_2$ are respectively configured to receive signals $a_i$ and $b_i$. Input buses of register $414_3$ and register $414_4$ are respectively configured to receive signals $a_r$ and $b_r$. Signals $a_i$, $a_r$, $b_i$, and $b_r$ are provided by programmable logic blocks of the FPGA. Each of signals $a_i$, $a_r$, $b_i$, and $b_r$ has a data width of N bits.

Output buses of register $416_0$ and $416_1$ respectively provide signals $q_r$ and $q_i$. Signals $q_r$ and $q_i$ are provided to the programmable logic blocks of the FPGA. In addition, an OP code signal may be provided by programmable logic blocks of the FPGA to pattern generator 412. The OP code may be used to select a specific one of a plurality of operations that may be performed by MAC 400. Pattern generator 412 produces an output pattern in response to clock signal M_CLK.

Output buses of register $414_1$ and $414_2$ are respectively coupled to inputs of multiplexer $402_1$. Output buses of register $414_3$ and $414_4$ are respectively coupled to inputs of multiplexer $402_2$. Control terminals of multiplexer $402_1$ and multiplexer $402_2$ are respectively configured to receive signals S1 and S2. Signals S1 and S2 are generated by pattern generator 412 in accordance with the OP code. The logical value of signal S1 determines which of signals $a_i$ and $b_i$ is selected by multiplexer $402_1$. Likewise, the logical value of signal S2 determines which of signals ar and br is selected by multiplexer $402_2$.

Input buses of multiplexer $402_3$ are respectively coupled to output buses of register $414_2$, register $414_3$, and register $414_4$. A control terminal of multiplexer 4023 is configured to receive a signal S3. Signal S3 is generated by pattern generator 412 in accordance with the OP code. The logical value of signal S3 determines which of signals $b_i$, $a_r$, and $b_r$ is selected by multiplexer $402_3$.

Output buses of multiplexer $402_1$ and multiplexer $402_2$ are respectively coupled to adder/subtracter 404. Adder/subtracter 404 adds or subtracts the output signal of multiplexer $402_1$ and the output signal of multiplexer $402_2$ in response to clock signal M_CLK. A control terminal of adder/subtracter 404 is configured to receive signal M1. Signal M1 is generated by pattern generator 412 in accordance with the OP code. The logical value of signal M1 determines whether adder/subtracter 404 performs an addition operation or a subtraction operation.

Multiplier 406 multiplies the output signal of adder/subtracter 404 and the output signal of multiplexer 4023 in response to clock signal M_CLK. Multiplier 406 provides an output signal having a data width of 2N bits to adder/subtracter 408. Adder/subtracter 408 adds or subtracts the output signal of multiplier 406 and an output signal of multiplexer 411 in response to clock signal M_CLK. A control terminal of adder/subtracter 408 is configured to receive signal M2. Signal M2 is generated by pattern generator 412 in accordance with the OP code. The logical value of signal M2 determines whether adder/subtracter 408 performs an addition operation or a subtraction operation. Adder/subtracter 408 provides an output signal having a data width of 3N bits.

Input buses of register $416_1$ and $416_2$ are respectively coupled to the output of adder/subtracter 408. The input buses of registers 416 have a data width of 2N bits. Control terminals of register 416₁ and register 416₂ are configured to respectively receive signals E2 and E3. Signals E2 and E3 are generated by pattern generator 412 in accordance with the OP code. The logical value of signal E2 determines whether register 416₁ is enabled. Likewise, the logical value of signal E3 determines whether register 416₂ is enabled.

Input buses of registers 410 are coupled to the output of adder/subtracter 408. Control terminals of registers 410₁ through 410₃ are respectively configured to receive signals R1 through R3, and E1 through E3, respectively. Signals R1 through R3 and E1 through E3 are generated by pattern generator 412 in accordance with the OP code. The logic value of each of signals R1 through R3 determines whether a respective one of registers 410 is cleared. The logic value of each of signals E1 through E3 determines whether a respective one of registers 410 is enabled.

Input buses of multiplexer 411 are respectively coupled to output buses of registers 410. A control terminal of multiplexer 411 is configured to receive signal S4. Signal S4 is generated by pattern generator in accordance with the OP code. The logical value of signal S4 determines which of the output buses of registers 410 is selected by multiplexer 411. As described above, an output bus of multiplexer 411 is coupled to adder/subtracter 408.

Programmable logic device with overclocked dedicated logic circuitry has been described. Dedicated logic circuitry embedded within a PLD operates at speeds in excess of the data rates supported by data paths through the PLD fabric. For example, multiply-accumulate circuits may operate at two, three, or four times the clock frequency of the PLD. This may advantageously be used to improve multiply-accumulate operations, such as the running convolutions computed for a finite impulse-response (FIR) filter, since the throughput of a MAC grows linearly with the factor by which the MAC is overclocked. In addition, advantageously I/O limitations of known embedded logic circuits are avoided by broadening the interface between the FPGA fabric and the dedicated logic circuit and embedding control circuitry to maintain flexibility of function within the dedicated logic circuit.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

The invention claimed is:

1. A device having programmable interconnections, the device further comprising:
    programmable function blocks operable using a first clock signal having a first frequency; and
    a dedicated circuit, comprising at least in part hardwired circuitry configured to perform a specific function, operable using a second clock signal synchronized with the first clock signal and having a second frequency, the second frequency being a function of the first frequency; and
    wherein the at least one dedicated circuit includes one or more multiply-accumulate circuits operable using the second clock signal.

2. The device of claim 1, further comprising:
    an interface coupled between one or more of the programmable function blocks and the dedicated circuit, the interface configured to multiplex output signals produced by the one or more programmable function blocks among input terminals of the dedicated circuit.

3. The device of claim 2, further comprising:
    a first bank of registers coupled between the dedicated circuit and the one or more programmable function blocks, the first bank of registers operable using the first clock signal; and
    a second bank of registers coupled between the at least one dedicated circuit and the one or more programmable function blocks, the second bank of registers operable using the second clock signal.

4. The device of claim 3, wherein the dedicated circuit further comprises a clock management circuit configured to receive the first clock signal and provide the second clock signal.

* * * * *